(12) United States Patent
Dorward et al.

(10) Patent No.: US 6,388,584 B1
(45) Date of Patent: *May 14, 2002

(54) METHOD AND APPARATUS FOR DATA COMPRESSION OF NETWORK PACKETS

(75) Inventors: Sean Matthew Dorward, Martinsville; Sean Quinlan, Hoboken, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/527,315

(22) Filed: Mar. 16, 2000

(51) Int. Cl.$^7$ .......................... H03M 7/34; H03M 7/00; H03M 7/40
(52) U.S. Cl. .............................. 341/51; 341/60; 341/65
(58) Field of Search ................................ 341/51, 60, 65

(56) References Cited

U.S. PATENT DOCUMENTS

| | | | | |
|---|---|---|---|---|
| 4,464,650 A | | 8/1984 | Eastman et al. ............. 340/347 |
| 4,558,302 A | | 12/1985 | Welch ......................... 340/347 |
| 4,730,348 A | | 3/1988 | MacCrisken ................ 375/122 |
| 5,293,379 A | | 3/1994 | Carr ........................... 370/94.4 |
| 5,369,605 A | | 11/1994 | Parks ...................... 364/715.09 |
| 5,414,425 A | | 5/1995 | Whiting et al. ................ 341/67 |
| 5,442,350 A | | 8/1995 | Iyer et al. ..................... 341/51 |
| 5,550,540 A | | 8/1996 | Furlan et al. ................. 341/51 |
| 5,572,206 A | | 11/1996 | Miller et al. .................. 341/51 |
| 5,572,209 A | | 11/1996 | Farmer et al. ................ 341/67 |
| 5,608,396 A | | 3/1997 | Cheng et al. ................. 341/50 |
| 5,663,721 A | | 9/1997 | Rossi ........................... 341/51 |
| 5,673,042 A | | 9/1997 | Yoshida et al. ................ 341/51 |
| 5,701,125 A | | 12/1997 | Berlin .......................... 341/63 |
| 5,701,468 A | | 12/1997 | Benayoun et al. ........... 395/612 |
| 5,703,581 A | | 12/1997 | Matias et al. ................. 341/67 |
| 5,815,097 A | * | 9/1998 | Schwartz et al. ............. 341/51 |
| 5,831,558 A | | 11/1998 | Harvell ....................... 341/106 |
| 6,121,903 A | * | 9/2000 | Kalkstein .................... 341/65 |
| 6,216,175 B1 | * | 4/2001 | Sliger et al. .................. 341/51 |
| 6,236,341 B1 | * | 5/2001 | Dorward et al. .............. 341/60 |
| 6,301,394 B1 | * | 10/2001 | Trout ........................... 341/51 |

FOREIGN PATENT DOCUMENTS

| | | | |
|---|---|---|---|
| EP | 0 643 491 A | 3/1995 | ............ H03M/7/42 |
| EP | 0 933 876 A | 8/1999 | ............ H03M/7/30 |

OTHER PUBLICATIONS

J. Ziv et al., "Compression of Individual Sequences via Variable–Rate Coding," *IEEE Transaction on Information Theory*, vol. IT–24, No. 5, Sep. 1978, pp. 530–536.

T. A. Welch, "A Technique for High–Performance Data Compression," *IEEE Computer*, Jun. 1984, pp. 8–19.

A. Shacham, et al., "IP Payload Compression Protocol (IPComp)," RFC 2393, Dec. 1998.

M. Degermark et al., "IP Header Compression," RFC 2507, Feb. 1999.

(List continued on next page.)

*Primary Examiner*—Trong Phan
(74) *Attorney, Agent, or Firm*—Donald P. Dinella (57) ABSTRACT

A method and apparatus for compressing packets that enables inter-packet compression thereby achieving greater robustness and increased compression ratios without the deleterious effects, e.g., the effect of packet loss multiplying, of prior compression schemes. More particularly, a so-called acknowledgment scheme is employed in conjunction with the specific compression algorithm such that the transmitter, i.e., sender, can limit the history used by the compression algorithm to those packets that are correctly received. In particular, a vector identifying the packets used as the history is included in the compressed packet thereby enabling the receiver to reconstruct the packet history state necessary to decompress the packet. Advantageously, increased robustness and greater compression ratios are achieved independent of any particular one compression scheme.

33 Claims, 3 Drawing Sheets

OTHER PUBLICATIONS

J. Ziv et al., "A Universal Algorithm for Sequential Data Compression," *IEEE Transactions on Information Theory,* vol. IT–23, No. 3, May 1977, pp. 337–343.

A. Moffat, "Implementing the PPM data compression scheme," *IEEE Trans. Communications,* vol. COM–38, Nov. 1990, pp. 1917–1920.

R. Pereira, "IP Payload Compression Using DEFLATE," RFC 2394, Dec. 1998, pp. 1–6.

T. C. Bell et al., "Modeling fot text compression," Computing Surveys 21 (4), Dec. 1989, pp. 557–591.

* cited by examiner

METHOD AND APPARATUS FOR DATA COMPRESSION OF NETWORK PACKETS

FIELD OF THE INVENTION

The present invention relates generally to data compression and, more particularly, to improving the compression of data in packet networks.

BACKGROUND OF THE INVENTION

Conventional data compression techniques and systems encode a stream of digital data into a compressed code stream and decode the compressed code stream back into a corresponding original data stream. The code stream is referred to as "compressed" because the stream typically consists of a smaller number of codes than symbols contained in the original data stream. Such smaller codes can be advantageously stored in a corresponding smaller amount of memory than the original data. Further, the compressed code stream can be transmitted in a communications system, e.g., a wired, wireless, or optical fiber communications system, in a corresponding shorter period of time than the uncompressed original data. The demand for data transmission and storage capacity in today's communications networks is ever-increasing. Thus, data compression plays an integral role in most modem transmission protocols and communications networks.

As is well-known, two classes of compression techniques useful in the compression of data are so-called special purpose compression and general purpose compression. Special purpose compression techniques are designed for compressing special types of data and are often relatively inexpensive to implement. For example, well-known special purpose compression techniques include run-length encoding, zero-suppression encoding, null-compression encoding, and pattern substitution. These techniques generally have relatively small compression ratios due to the fact that they compress data which typically possesses common characteristics and redundancies. As will be appreciated, a compression ratio is the measure of the length of the compressed codes relative to the length of the original data. However, special purpose compression techniques tend to be ineffective at compressing data of a more general nature, i.e., data that does not possess a high degree of common characteristics and the like.

In contrast, general purpose compression techniques are not designed for specifically compressing one type of data and are often adapted to different types of data during the actual compression process. Some of the most well-known and useful general purpose compression techniques emanate from a family of algorithms developed by, J. Ziv and A. Lempel, and commonly referred to in the art as "Lempel-Ziv coding". In particular, Ziv et al., "A Universal Algorithm for Sequential Data Compression", *IEEE Transactions on Information Theory*, IT-23(3):337–343, May 1977 (describing the commonly denominated "LZ1" algorithm), and Ziv et al., "Compression of Individual Sequences Via Variable-Rate Coding", *IEEE Transactions on Information Technology*, IT-24(5):530–536, September 1978 (describing the commonly denominated "LZ2" algorithm), which are each hereby incorporated by reference for all purposes. The LZ1 and LZ2 data compression schemes are well-known in the art and need not be discussed in great detail herein.

In brief, the LZ1 (also referred to and known in the art as "LZ77") data compression process is based on the principle that a repeated sequence of characters can be replaced by a reference to an earlier occurrence of the sequence, i.e., matching sequences. The reference, e.g., a pointer, typically includes an indication of the position of the earlier occurrence, e.g., expressed as a byte offset from the start of the repeated sequence, and the number of characters, i.e., the matched length, that are repeated. Typically, the references are represented as "<offset, length>" pairs in accordance with conventional LZ1 coding. In contrast, LZ2 (also referred to and known in the art as "LZ78") compression parses a stream of input data characters into coded values based on an adaptively growing look-up table or dictionary that is produced during the compression. That is, LZ2 does not find matches on any byte boundary and with any length as in LZ1 coding, but instead when a dictionary word is matched by a source string, a new word is added to the dictionary which consists of the matched word plus the following source string byte. In accordance with LZ2 coding, matches are coded as pointers or indexes to the words in the dictionary.

As mentioned above, the art is replete with compression schemes derived on the basic principles embodied by the LZ1 and LZ2 algorithms. For example, Terry A. Welch (see, T. A. Welch, "A Technique for High Performance Data Compression", *IEEE Computer*, pp. 8–19, June 1984, and U.S. Pat. No. 4,558,302, issued to Welch on Dec. 10, 1985, each of which is incorporated by reference for all purposes) later refined the LZ2 coding process to the well-known "Lempel-Ziv-Welch" ("LZW") compression process. Both the LZ2 and LZW compression techniques are based on the generation and use of a so-called string table that maps strings of input characters into fixed-length codes. More particularly, these compression techniques compress a stream of data characters into a compressed stream of codes by serially searching the character stream and generating codes based on sequences of encountered symbols that match corresponding longest possible strings previously stored in the table, i.e., dictionary. As each match is made and a code symbol is generated, the process also stores a new string entry in the dictionary that comprises the matched sequence in the data stream plus the next character symbol encounter in the data stream.

As will be appreciated and as detailed above, the essence of Lempel-Ziv coding is finding strings and substrings which are repeated in the original data stream, e.g., in a document to be transmitted. The repeated phrases in the document under compression are replaced with a pointer to a place where they have occurred earlier in the original data stream, e.g., document. As such, decoding data, e.g., text, which is compressed in this manner simply requires replacing the pointers with the already decoded text to which it points. As is well-known, one primary design consideration in employing Lempel-Ziv coding is determining whether to set a limit on how far back a pointer can reach, and what that limit should be. A further design consideration of Lempel-Ziv coding involves which substrings within the desired limit may be a target of a pointer. That is, the reach of a pointer into earlier text may be unrestricted, i.e., a so-called growing window, or may be restricted to a fixed size window of the previous "N" characters, where N is typically in the range of several thousand characters, e.g., 3 kilobytes. In accordance with this coding repetitions of strings are discovered and compressed only if they both appear in the window. As will be appreciated, the considerations made regarding such Lempel-Ziv coding design choices represent a compromise between speed, memory requirements, and compression ratio.

Compression is a significant consideration in improving network efficiencies. For example, when the available computational resources, i.e., the data processing requirements, are large compared to the available network bandwidth, it is most advantageous to compress data packets before transmission across the network. Of course, the actual compression scheme must be carefully selected in terms of speed and overall compression. That is, a compression scheme which is too slow will reduce network performance and an inefficient compression scheme will limit any potential transmission gains.

Further complicating the network efficiency issue is the fact that many packet networks are inherently unreliable. That is, current well-known packet networks, e.g., the Internet, routinely drop packets or reorder packets transmitted through the network thereby causing data transmission errors. For example, if the compression scheme introduces certain dependencies between packets, and the network thereafter drops or reorders such packets, the receiver may not be able to decompress a particular packet if a prior packet is lost due to the interdependencies amongst packets. As such, certain well-known approaches are employed to mitigate such problems: (1) Improve network reliability whereby, in terms of the Internet, a more reliable end-to-end transport layer service can be applied, e.g., the well-known Transmission Control Protocol ("TCP"), to compress packets at the transport level; (2) Stateless compression can be used wherein each packet is compressed independently thereby ensuring that each packet can be decompressed at the receiver; and (3) Streaming compression assumes reliable delivery and employs a reset mechanism when this assumption is violated. More particularly, when a packet is lost, the receiver discards each subsequent packet until compression is reset. After the reset, future packets are not dependent on prior packets and decompression can resume normally. Two well-known streaming-type compression techniques include the Point-to-Point Protocol's ("PPP") Compression Control Protocol, and the IP Header Compression protocol employed for Use Datagram Protocol ("UDP") packets.

The above-described packet compression schemes are useful in mitigating the problems arising from packet interdependencies, however, such schemes present certain other complications. For example, compressing packets at the transport level requires end-to-end utilization, and typically requires a certain level of cooperation by the application during transmission. Similarly, while stateless compression provides a degree of robustness, the packet independence attribute of stateless compression reduces the realized compression ratio due to the fact that such compression examines the data in a single packet. Thus, for example, this compression approach cannot remove the large amount of redundancy typically found in network headers of adjacent packets. Further, while streaming compression provides greater compression ratios, these compression schemes multiply the effect of packet loss in that when one packet is lost in the network this causes the receiver to lose several other packets. For low reliability networks, e.g., the Internet, this multiplying packet effect reduces the utility of employing streaming compression.

Therefore, a need exists for a compression technique which provides greater robustness and increased compression ratios without the deleterious effects of prior compression schemes.

SUMMARY OF THE INVENTION

An aspect of the invention is directed to a communications method and apparatus that enables inter-packet compression thereby achieving greater robustness and increased compression ratios without the deleterious effects, e.g., the effect of packet loss multiplying, of prior compression schemes. In accordance with an aspect of the invention, a select history state is employed which is determined as a function of a so-called acknowledgement vector. In accordance with an aspect of the invention, the acknowledgement vector contains information with respect to the identification of packets which have been successfully received in a prior transmission over a communications channel. That is, in accordance with an aspect of the invention, the packet history state is a select history state associated with a respective packet. As such, a first side of the communications channel e.g., the transmitter or sender side, is furnished and cognizant of certain information about which packets have been successfully received by the second side of the communications channel, e.g., the receiver or recipient side. In turn, the decompressor is also furnished and cognizant of the select history to allow for efficient decompression of the transmitted compressed packets from the sender. That is, decompression occurs as a function of which packets were used as history, i.e., the select history state, during compression of such packets. As such, through select history state and acknowledgement aspects of the invention, the compressor and decompressor (at either side of the communications channel) work cooperatively to achieve improved compression across a communications channel.

In accordance with the preferred embodiment of the invention, the packets are encoded and prefixed with a header that includes at least a history vector, such history state identifying the respective history state associated with a packet. Further, in accordance with an aspect of the invention, the acknowledgment vector is constructed and communicated to the transmitter, whereby the specific compression algorithm at the transmitter, i.e., sender, can limit the history used by the compression algorithm to those packets that are successfully received. Thus, in accordance with the preferred embodiment, the vector identifying the packets used as the history is included in the compressed packet thereby enabling the receiver to reconstruct the packet history state necessary to decompress the packet.

Advantageously, in accordance with an aspect of the invention, increased robustness and greater compression ratios are achieved with a wide variety of compression methods or communications channel arrangements. That is, the principles of the invention are independent of any particular one compression scheme and, therefore, the advantages of employing the various aspects of invention are realized with a wide variety of compression methodologies and communications channel configurations.

BRIEF DESCRIPTION OF THE DRAWINGS

Throughout this disclosure, unless otherwise noted, like elements, blocks, components or sections in the figures are denoted by the same reference designations.

DETAILED DESCRIPTION

An aspect of the invention is directed to a communications method and apparatus that enables inter-packet compression thereby achieving greater robustness and increased compression ratios without the deleterious effects, e.g., the effect of packet loss multiplying, of prior compression schemes. In accordance with an aspect of the invention, a select history state is employed which is determined as a function of a so-called acknowledgement vector. In accordance with an aspect of the invention, the acknowledgement vector contains information with respect to the identification of packets which have been successfully received in a prior transmission over a communications channel. That is, in accordance with an aspect of the invention, the packet history state is a select history state associated with a respective packet. As such, a first side of the communications channel e.g., the transmitter or sender side, is furnished and cognizant of certain information about which packets have been successfully received by the second side of the communications channel, e.g., the receiver or recipient side. In turn, the decompressor is also furnished and cognizant of the select history to allow for efficient decompression of the transmitted compressed packets from the sender. That is, decompression occurs as a function of which packets were used as history, i.e., the select history state, during compression of such packets.

The various aspects of the present invention can be embodied in the form of methods and apparatuses for practicing those methods. The invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The invention can also be embodied in the form of program code, for example, in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Figure 1:
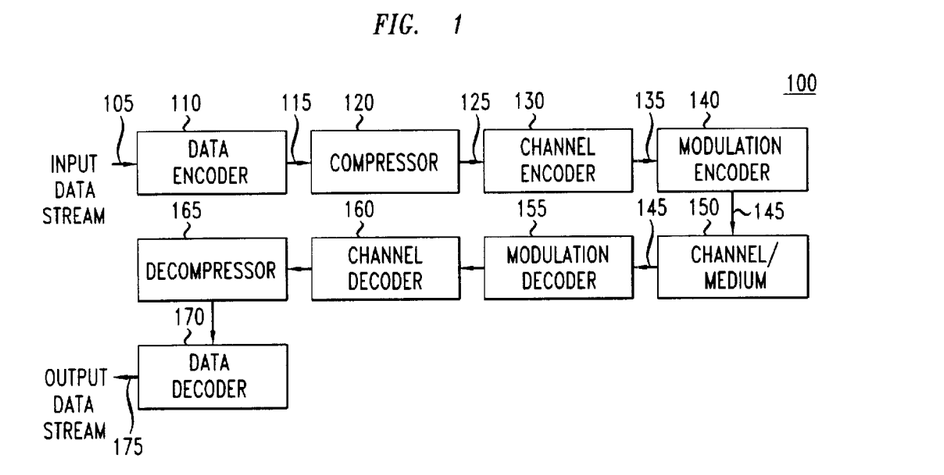
FIG. 1 shows a block diagram of an illustrative system for compressing and decompressing data.

FIG. 1 shows a block diagram of an illustrative system 100 for compressing and decompressing data. System 100, inter alia., is useful for transmitting and receiving information over a transmission medium, e.g. wire, wireless, or optical fiber, to name just a few. Further, system 100 is alternatively useful for recording information to, and reading information from, for example, a magnetic medium such as computer disk drives, or optical-readable medium such as CD-ROM's. As such, it is possible to record data compressed in accordance with the invention on to recordable medium including magnetic medium, e.g., magnet disk drives, and optical recordable medium, e.g., CD-ROM's. In FIG. 1, input data stream 105, e.g., text, is provided to input data encoder 110. As discussed in greater detail below, input data encoder 110, in accordance with an aspect of the invention, preprocesses and encodes the input data stream, by applying a variable history state inter-packet compression. The various aspects of the invention directed at this encoding process are described in greater detail below with particular reference to the illustrative operations shown in FIG. 2.

Continuing with the discussion of illustrative system 100 of FIG. 1, encoded input data stream 115 produced in accordance with an aspect of the invention is passed to compressor 120. Compressor 120, in accordance with the preferred embodiment of the invention, applies a compression methodology, e.g., Lempel-Ziv compression, to compress encoded input data stream 115 to compressed data 125. As mentioned above, it will again be noted that any Lempel-Ziv type compression can be used effectively in compressing encoded input data stream 115 in accordance with the invention and for realizing the advantageous aspects of the invention as described herein. Compressed data 125 is then encoded by channel encoder 130 to produce channel encoded information 135. As will be appreciated, channel encoding adds information to the compressed information to enable error detection and/or correction in the data reading process. Conventional channel encoding techniques include well-known Reed-Solomon encoding which encodes a sequence of symbols wherein each symbol is represented by one or more data bits. These symbols are then modulation encoded by modulation encoder 140 which produces modulated data stream 145 which defines a channel sequence that is transmitted through a communications channel or recorded on medium 150.

Noise and interference are often times introduced in channel/medium 150 during the transmission or recording of the data stream. As such, modulation decoder 155 and channel decoder 160 receive modulated data stream 145 with the noise and, in a well-known manner, reverse the encoding processes of channel encoder 130 and modulation encoder 140, respectively. The data stream from channel decoder 160 corresponds to compressed data 125 generated by compressor 120. This data stream is then decompressed, in accordance with the invention, by decompressor 165 and decoded by data decoder 170 producing output data stream 175 as described in detail below with regard to FIG. 4.

Figure 2:
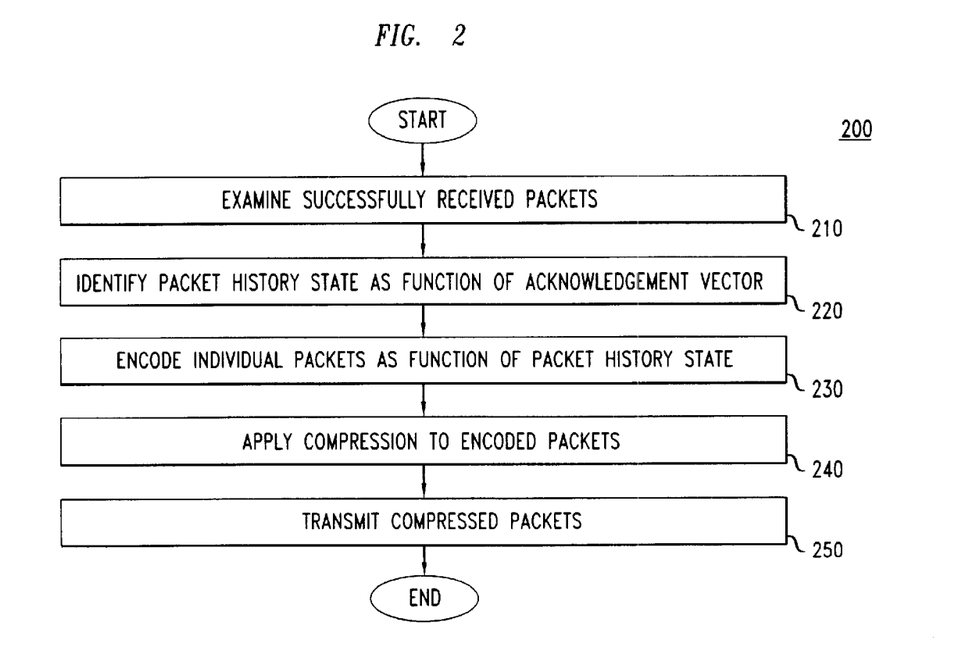
FIG. 2 shows a flowchart of illustrative operations for compressing data in accordance with an aspect of the invention and useful in the illustrative system of FIG. 1.

The various aspects of the invention are directed to realizing improved compression robustness and compression ratios. FIG. 2 shows a flowchart of illustrative operations 200 for compressing data in accordance with an aspect of the invention and useful in the illustrative system of FIG. 1, as described above. More particularly, an input data stream is received and the successfully received packets are examined (see, FIG. 2, block 210). Examination of the successfully received packets allows for, in accordance with this aspect of the invention, the identification of a packet history state as a function of the acknowledgement vector (see, FIG. 2, block 220). In accordance with the preferred embodiments of the invention, the packet history state is a previous set of packets upon which the compression of the current packet is determined. For example, in terms of Lempel-Ziv 77 compression history state is a direct correlation to the so-called dictionary employed in such Lempel-Ziv compression. Interestingly, a major difference between the aforementioned stateless compression and streaming compression of network packets is the particular history state each scheme employs. That is, stateless compression employs no history state, while streaming compression allows any previous packet as history. Such differences hold still further with respect to the principles of the invention.

More particularly, in accordance with the preferred embodiment of the invention, the packet history state is a select history state with respect to particular packets that have been successfully received across the communications channel e.g., by the receiver side or recipient. In turn, the recipient is furnished and cognizant of the select history to allow for efficient decompression of the transmitted compressed packets. Advantageously, in accordance with this aspect of the invention, utilizing the select inter-packet history state improves the compression robustness and ratio over prior streaming compression schemes which suffer from their inherent packet losses.

Figure 3:
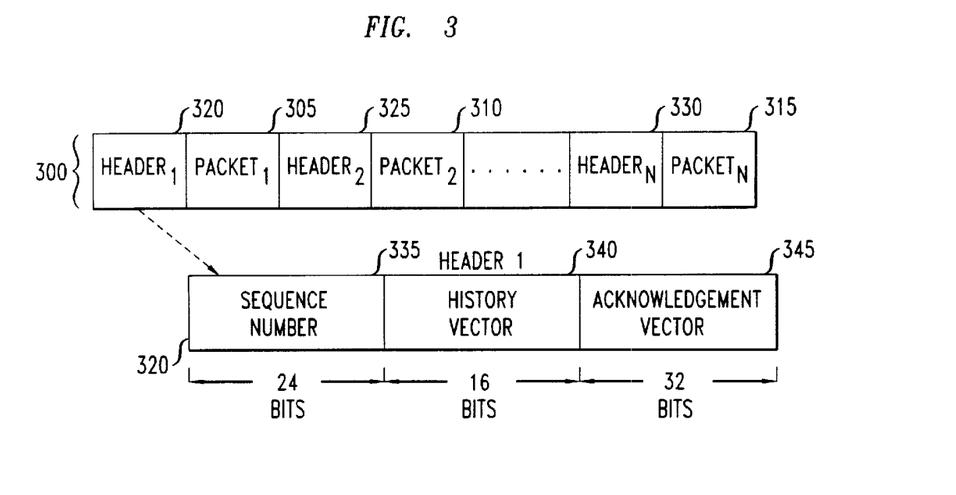
FIG. 3 shows an illustrative packet stream compressed in accordance with the illustrative operations of the invention of FIG. 2.

After identifying the select packet history state as detailed above, such history state is employed to encode certain information to the packets waiting for transmission from the sender. More particularly, in accordance with the preferred embodiment of the invention, the individual packets are encoded as a function of the respective packet history state associated therewith (see, FIG. 2, block 230). In accordance with an embodiment of the invention, each packet is prefixed with a header that includes, illustratively, a history vector which identifies the respective packet history associated with that packet. Turning our attention briefly to FIG. 3, an illustrative packet stream 300 is shown compressed in accordance with the illustrative operations of FIG. 2. In accordance with the embodiment of FIG. 3, the packet header includes additional items such as a sequence number and the acknowledgement vector. That is, in accordance with further embodiments of the invention, the aforementioned acknowledgement vector may be transmitted as part of the packet header. As will be appreciated by those skilled in the art, the determination of whether the acknowledgement vector is transmitted separately from the encoded packets (as discussed above) or as part of the packet header is a matter of design choice with the principles of the invention applying equally in either context. For example, the acknowledgement vector can be transmitted to the sender using a so-called "piggybacking" technique where there exists a data stream in the opposite direction from the receiver to the sender.

For example, packet stream 300 includes a series of packets (e.g., packet 1 through packet n shown as packets 305–315, respectively, in FIG. 3). In addition, each packet includes a header (e.g., $H_l$ through $H_n$, shown as headers 320–330, respectively, in FIG. 3). Further, illustratively, header 320 is shown in greater detail including the encoded sequence number 335, history vector 340, and acknowledgement vector 345.

In accordance with the preferred embodiment, the sequence number, e.g., sequence number 335, is utilized by both the sender and receiver to identify packets compressed in accordance with the principles of the invention. The number of bits used for encoding the sequence number need to be sufficient to avoid the well-known adverse consequences of so-called "wrapping" during the maximum time required to traverse the entire network. Illustratively, sequence number 335 is shown as 24 bits in length.

Further, in accordance with the preferred embodiment, the history vector, e.g., history vector 340, describes the set of previous packets used for compression, i.e., the select history state. In terms of the preferred embodiment of the invention which utilizes the acknowledgement packets for history determination, a time delay may occur related to the roundtrip time of the network between the time a packet is transmitted and the time that the packet will be used as history. As such, in accordance with the preferred embodiment of the invention, the history vector is encoded using an offset and a bit mask such that the offset is subtracted from the packet's sequence number to establish the sequence number of the most recent history packet. The bit mask identifies additional history packets directly preceding this most recent history packet. Illustratively, in terms of header 320, history vector 340 includes 8 bits of offset and 8 bits of mask thereby limiting the history state to at most nine consecutive packets within the last 263.

As mentioned above, the packet header of the FIG. 3 embodiment also includes the acknowledgement vector, e.g., acknowledgement vector 345, describing a set of recently received packets. The acknowledgement vector includes at least the sequence number of the most recently received packet and a bit mask describing the status of the directly preceding packets. Illustratively, acknowledgement vector 345 is 32 bits in length to cover 24 bits for the sequence number and 8 bits for the associated mask.

Turning our attention back to FIG. 2, after encoding the packets as a function of their respective packet history states (see, FIG. 2, block 230) in accordance with the principles of the invention, these packets are ready for further compression. As detailed above, an advantage of the instant invention is that it may be applied in conjunction with a large variety of existing compression techniques. For example, as described in greater detail below, the principles of the invention improve the compression of a packet stream to which well-known LZ77 compression is applied or the well-known "Deflate" compression scheme. Thus, after applying the selected compression scheme to the encoded packets (see, FIG. 2, block 240), the compressed packets are ready for transmission (see, FIG. 2, block 250).

In accordance with an aspect of the invention, we have recognized that by employing a select history state as a function of the packets for transmission across a network, the delivery of an elegant compression tool is achieved by which enhanced data compression can be realized. That is, in accordance with an aspect of the invention, the packet history state associated with a respective one of the packets is a select history state in that the transmission side, i.e., sender, is furnished and cognizant of certain information about which packets have been successfully received by the receiver side, i.e., recipient. In turn, the receiver side is also furnished and cognizant of the select history state associated with such packets to allow for efficient decompression of the transmitted compressed packets from the sender. As such, through select history state and acknowledgement aspects of the invention, the sender and receiver work cooperatively to achieve improved compression across the communications channel.

More particularly, in accordance with an aspect of the invention, the acknowledgment vector is employed in conjunction with the specific compression algorithm such that the transmitter, i.e., sender, can limit the history used by the compression algorithm to those packets that are correctly received. Thus, in accordance with an embodiment of the invention, the vector identifying the packets used as the history is included in the compressed packet thereby enabling the receiver to reconstruct the packet history state necessary to decompress the packet. In accordance with further embodiments of the invention, the acknowledgement vector is transmitted separately from the compressed packets. Further, while the illustrative embodiments herein, for clarity, discuss a single communications channel arrangement, it will be understood that the principles of the invention are equally applicable to multiple communications channel arrangements and configurations. Advantageously, in accordance with this aspect of the invention, utilizing the select history state improves the compression robustness and ratio over prior streaming compression schemes which suffer from inherent compounding of packet losses.

Figure 4:
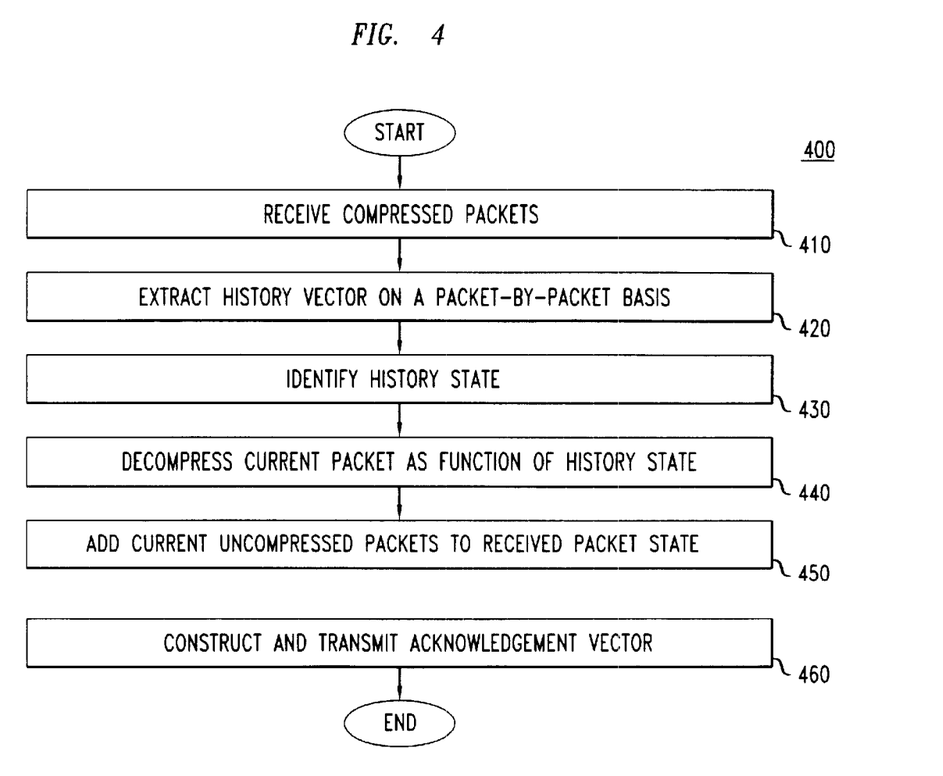
FIG. 4 shows a flowchart of illustrative operations for decompressing data in accordance with an aspect of the invention and useful in the illustrative system of FIG. 1.

Prior to describing certain illustrative compression testing results which further detail the advantages of various aspects of the invention, the decompression aspects of the invention, as detailed above, will now be discussed. In particular, FIG. 4 shows a flowchart of illustrative operations 400 for decompressing data in accordance with a further aspect of the invention. More particularly, from the compressed stream of packets received (see, FIG. 4, block 410), the history vector is extracted (see, FIG. 4, block 420) on a packet-by-packet basis. Illustratively, the following pseudocode describes the extraction of these items in accordance with an embodiment of the invention:

```
extract the sequence number from the packet
extract the offset and mask of the history vector
if offset is zero then no history
else {
   subtract offset from the sequence number to give first
       packet in history.
   while the mask !=0 {
subtract one from sequence number
if low bit is set in mask then add packet to history
shift mask to the right one bit
   }
}
decompress packet
extract acknowledgement vector and the sequence num-
   ber of most recently received packet and bit mask
```

As will be appreciated, the above-described pseudocode can be used by those skilled in the art to develop a variety of programs, e.g., a computer program in the well-known C programming language, for execution in a processor for implementing the invention. From the extraction of the history vector, the history state of the packet under decompression is identified (see, FIG. 4, block 430). In accordance with further embodiments of the invention, the extraction may also include extracting the acknowledgment vector and the sequence number from the packet header. In accordance with the preferred embodiment of the invention, decompression of the current packet can proceed as a function of the identified history state (see, FIG. 4, block 440). As such, the current uncompressed packet is added to the current received packet state (see, FIG. 4, block 450) of the respective decompressor, e.g., the decompressor on the receive side of the specific communications channel, thereby updating the set of received packets. Finally, after decompressing the current packet, the acknowledgement vector is constructed and transmitted (see, FIG. 4, block 460) back to the sender. As detailed previously, the acknowledgement vector describes the set of recently received packets and will be used by the sender to compress future packets in conjunction with the select history state in accordance with an aspect of the invention.

To further illustrate the various aspects of the invention and their advantages, the principles of the invention were applied in the context of certain compression simulations utilizing two well-known compression formats mentioned above. More particularly, the Deflate compression format was utilized in conjunction with a predefined sequence of data packets. As is well-known, Deflate is a popular compression format that is the basis for many well-known file formats such as "gzip", "zip" and "png", to name a few. Deflate combines LZ77 and Huffman encodings and, in the context of network protocols, has been used with PPP. In terms of the instant illustrative example, the well-known and publicly available via the Internet at http:www.cdrom.com/ pub/infozip/zlib. Zlib implementation of Deflate was utilized with the compression level set to the default value of six (6).

More particularly, fourteen commonly used files from the well-known Calgary Corpus (a widely used standard reference for evaluating the effectiveness of compression algorithms, see, e.g., T. C. Bell et al., Modeling for text compression, *Computing Surveys* 21(4):557–591, December 1989) were employed to identify a input data stream for compression. A byte sequence was created by concatenating the fourteen Calgary Corpus files in alphabetical order, and dividing the input stream into fixed sized packets of 1600 byte packets and 125 byte packets, respectively. As detailed above, an aspect of the invention includes acknowledgements of packets transmitted across communications channels. The present compression simulation examples, model the acknowledgements as arriving at the compressor across a variety of acknowledgment, i.e., packet, delays.

Figure 5:
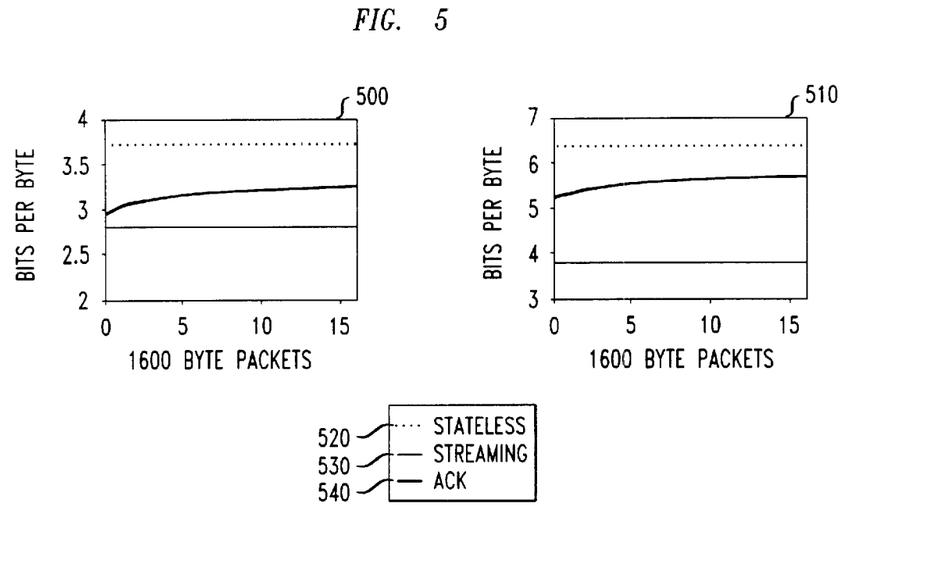
FIG. 5 shows compression results for a variety of packet sizes in terms of a comparison between known compression schemes and compression in accordance with the various aspects of the invention.

The illustrative example compares the effect of delay on the number of output bits per input byte for the respective packet size of 1600 bytes and 125 bytes. More particularly, FIG. 5 show simulation results 500 and 510 for such respective packet sizes in terms of a comparison among a known stateless compression scheme, see, e.g., stateless compression results 520, a known streaming compression scheme, see, e.g., streaming compression results 530, and compression in accordance with the principles of the invention, illustratively, referred to herein for convenience as the so-called "acknowledged compression (Ack)", see, e.g., Ack results 540. As can be understood from simulation results 500 and 510, Ack results 540 provides substantially greater compression than stateless results 520, but not as great as streaming results 530. Of course, as will be appreciated, streaming results 530 does not account for the effect of packet loss which, as detailed previously, is inherent in such compression. In contrast, Ack results 540 achieved in accordance with the principles of the invention are not significantly impacted by any such packet loss.

The foregoing merely illustrates the principles of the present invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the Applicants to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flowcharts, flow diagrams, state transition diagrams, pseudocode, program code, and the like represent various processes which may be substantially represented in computer readable medium and so executed by a computer, machine, or processor, whether or not such computer, machine, or processor, is explicitly shown.

We claim:

1. A data communications method comprising:
   dividing the input stream of data into a plurality of packets;
   identifying a respective packet history state for particular ones of the packets as a function of at least one acknowledgement vector;
   encoding the particular ones of the plurality of packets as a function of the respective packet history associated therewith; and
   compressing the plurality of packets into a compressed data stream.

2. The method of claim 1 wherein the respective packet history state associated with the packet is identified as a function of a plurality of received packets.

3. The method of claim 2 wherein the plurality of received packets represent packets which have been previously received by a receiver without a transmission error.

4. The method of claim 2 wherein each packet has a respective packet header, the packet header including at least a history vector which identifies the respective packet history state of the packet.

5. The method of claim 3 wherein the acknowledgement vector is generated by the receiver.

6. The method of claim 3 wherein the acknowledgement vector includes a sequence number of the particular received packet which was last received.

7. The method of claim 4 wherein the packet header includes a sequence number identifying a particular received packet.

8. A method of transmitting a communications stream between a sending location and a receiving location across a communications channel, the method comprising:
   dividing the communications stream into a plurality of packets;
   identifying a respective packet history state for particular ones of the packets as a function of a first acknowledgement vector, the first acknowledgement vector being received by the sending location from the receiving location;
   encoding the particular ones of the packets as a function of the respective packet history associated therewith, each such packet having a packet header associated therewith, the packet header including at least a history vector which identifies the respective packet history state of the packet;
   compressing the plurality of packets into a compressed data stream; and
   transmitting, across the communications channel, the compressed data stream from the sending location to the receiving location.

9. The method of claim 8 wherein the respective packet history state associated with the packet is identified as a function of a plurality of received packets at the receiver location.

10. The method of claim 9 wherein the first acknowledgement vector includes a sequence number of a particular received packet which was last received by the receiving location.

11. The method of claim 9 wherein Lempel-Ziv coding is employed in the compressing the packets.

12. The method of claim 8 further comprising:
   receiving the compressed data stream at the receiving location,
   extracting the respective history state associated with the particular ones of the packets; and
   decompressing the compressed data stream to recover the plurality of packets, the particular ones of the encoded packets being decompressed as a function of the extracted packet history associated therewith.

13. The method of claim 12 further comprising:
   updating a received packet state as a function of the decompressed packets.

14. The method of claim 13 further comprising:
   constructing a second acknowledgment vector, the second acknowledgement vector confirming a receipt of the decompressed packets by the receiving location; and
   transmitting the second acknowledgement vector from the receiver location to the sending location.

15. A method of recovering data from a compressed data stream, the method comprising:
   receiving the compressed data stream, the compressed data stream including a plurality of encoded packets;
   identifying a respective history state associated with particular ones of the encoded packets; and
   decompressing the compressed data stream to recover the data; the particular ones of the encoded packets being decompressed as a function of the respective packet history associated therewith.

16. The method of claim 15 further comprising:
   updating a received packet state as a function of the packets being decompressed.

17. The method of claim 16 further comprising:
   constructing an acknowledgment vector; and
   transmitting the acknowledgement vector from a receiver to a transmitter, the receiver and the transmitter exchanging the compressed data stream across at least one communications channel.

18. A data communications apparatus comprising:
   a receiver for receiving a data stream for transmission by the apparatus, the data stream comprising a plurality of packets;
   a encoder for identifying a plurality of packet history states as a function of at least one acknowledgement vector, each packet history state being associated with a respective one of the packets, and for encoding the plurality packets as a function of the plurality of history states; and
   a compressor for compressing the packets into a compressed data stream.

19. The data communications apparatus of claim 18 further comprising:
   a transmitter for transmitting the compressed data stream across a communication channel.

20. The data communications apparatus of claim 19 wherein the communications channel is part of an Internet.

21. The data communications apparatus of claim 18 further comprising:
   a decompressor for receiving an input data stream, the input data stream including a plurality of compressed packets, identifying a respective history state associated with particular ones of the compresses packets and decompressing the plurality of compressed packets, the particular ones of the compressed packets being decompressed as a function of the respective packet history associated therewith.

22. The data communications apparatus of claim 21 wherein the decompressor constructs at least one acknowledgement vector for transmission from the data communications apparatus.

23. The data communications apparatus of claim 22 wherein the acknowledgement vector confirms a receipt of the decompressed packets by the data communications apparatus.

24. The data communications apparatus of claim 18 wherein the compressor utilizes Lempel-Ziv coding for the compressing the packets into the compressed data stream.

25. An apparatus for processing a compressed digital signal, the compressed digital signal being produced by, dividing an input stream of digital data into a plurality of packets; identifying a respective packet history state for particular ones of the packets as a function of at least one acknowledgement vector, encoding the particular ones of the packets as a function of the respective packet history associated therewith, each packet having a packet header associated therewith, the packet header including at least a history vector which identifies the respective packet history state of the packet, compressing the encoded packets into the compressed digital signal and applying the compressed digital signal to a communications channel, the apparatus comprising:

a receiver for receiving the compressed digital signal from the communications channel; and a decompressor for decompressing the received compressed digital signal, and recovering the input stream of digital data from the decompressed digital signal.

26. The apparatus of claim 25 wherein the particular ones of the packets are decompressed from the compressed digital signal as a function of the respective packet history associated therewith.

27. The apparatus of claim 26 wherein the decompressor constructs an acknowledgment vector, and transmits the acknowledgement vector from a receiver to a transmitter, the receiver and the transmitter exchanging the compressed digital signal across the communications channel.

28. The apparatus of claim 27 wherein the compressing the packets operation utilizes Lempel-Ziv coding.

29. The apparatus of claim 27 wherein the decompressor updates the respective history state of the associated packet upon being decompressed.

30. A machine-readable medium having stored thereon a plurality of instructions, the plurality of instructions including instructions that, when executed by a machine, cause the machine to perform of a method of transmitting a communications stream between a sending location and a receiving location across a communications channel by dividing the communications stream into a plurality of packets; identifying a respective packet history state for particular ones of the packets as a function of a first acknowledgement vector, the first acknowledgement vector being received by the sending location from the receiving location; encoding the particular ones of the packets as a function of the respective packet history associated therewith, each such packet having a packet header associated therewith, the packet header including at least a history vector which identifies the respective packet history state of the packet; compressing the plurality of packets into a compressed data stream; and transmitting, across the communications channel, the compressed data stream from the sending location to the receiving location.

31. The machine-readable medium of claim 30 wherein the respective packet history state associated with the packet is identified as a function of a plurality of received packets at the receiver location.

32. The machine-readable medium of claim 31 including further instructions such that the method further comprises the operations of:

receiving the compressed data stream at the receiving location, extracting the respective history state associated with the particular ones of the packets; and decompressing the compressed data stream to recover the plurality of packets, the particular ones of the encoded packets being decompressed as a function of the extracted packet history associated therewith.

33. The machine-readable medium of claim 31 including further instructions such that the method further comprises the operations of:

constructing a second acknowledgment vector, the second acknowledgement vector confirming a receipt of the decompressed packets by the receiving location; and transmitting the second acknowledgement vector from the receiver location to the sending location.

* * * * *